(12) United States Patent
Sapashe et al.

(10) Patent No.: US 7,469,051 B2
(45) Date of Patent: Dec. 23, 2008

(54) METHOD AND APPARATUS FOR MAINTAINING AUDIO LEVEL PREFERENCES IN A COMMUNICATION DEVICE

(75) Inventors: Darren T. Sapashe, Delray Beach, FL (US); Chanhlong C. Lam, Coral Springs, FL (US)

(73) Assignee: Motorola, Inc., Schaumburg, IL (US)

( * ) Notice: Subject to any disclaimer, the term of this patent is extended or adjusted under 35 U.S.C. 154(b) by 811 days.

(21) Appl. No.: 10/660,213

(22) Filed: Sep. 11, 2003

(65) Prior Publication Data

US 2005/0059369 A1 Mar. 17, 2005

(51) Int. Cl.
- H03G 3/00 (2006.01)
- H03G 3/20 (2006.01)
- H02B 1/00 (2006.01)
- H04M 1/00 (2006.01)
- H04B 1/16 (2006.01)
- H04B 1/18 (2006.01)
- H04B 1/06 (2006.01)

(52) U.S. Cl. .................... 381/104; 381/107; 381/123; 381/57; 381/58; 381/109; 379/392.01; 379/420.01; 379/422; 379/420.03; 455/200.1; 455/177.1; 455/355

(58) Field of Classification Search ............. 381/57–61, 381/104, 107, 123, 102, 109; 455/200.1, 455/177.1, 355; 379/392.01, 420.01–420.03, 379/422, 388.01–388.06
See application file for complete search history.

(56) References Cited

U.S. PATENT DOCUMENTS

| | | | |
|---|---|---|---|
| 5,073,928 A * | 12/1991 | Shimanuki | 379/70 |
| 5,291,558 A * | 3/1994 | Ross | 381/107 |
| 5,666,426 A * | 9/1997 | Helms | 381/57 |
| 5,790,671 A * | 8/1998 | Cooper | 381/57 |
| 5,844,983 A * | 12/1998 | Lilja | 379/418 |

* cited by examiner

Primary Examiner—Vivian Chin
Assistant Examiner—Devona E Faulk
(74) Attorney, Agent, or Firm—Barbara R. Doutre

(57) ABSTRACT

An intelligent automatic volume control technique (100) for a communication device is provided that takes a measurement of the background audio environment at the time a user manually selects the volume (102, 104). A user preference is established for the volume setting relative to the background audio level being experienced (106). The informational relationship is stored and used for automatic volume control (108). When the background noise changes (110), the automatic volume control makes an intelligent decision on changing the volume (116). The current background noise level, the initial user volume setting and the background noise level when that volume was set are all used in the volume change decision making process.

4 Claims, 2 Drawing Sheets

METHOD AND APPARATUS FOR MAINTAINING AUDIO LEVEL PREFERENCES IN A COMMUNICATION DEVICE

TECHNICAL FIELD

This invention relates in general to communication devices and more particularly to volume control preferences for such communication devices.

BACKGROUND

Communication devices, such as two-way radios, are used in a variety of environments that have various levels of background noise. Traditional automatic volume control (AVC) usually changes the level of received audio by measuring the environmental level around the listener. Despite what the conditions were at initial user volume selection, AVC will set the volume higher when the background noise increases and set it lower when the background noise decreases. The disadvantage of the traditional AVC, however, is that any user preferences are eliminated. For example, a user might prefer a high volume level in a low background noise environment because he or she was located away from the speaker. Traditional AVC would detect the low background noise condition and immediately set the volume to a lower setting regardless of the user's wishes.

Accordingly, there is a need for an improved method and apparatus of automatically maintaining volume preferences in a communication device.

BRIEF DESCRIPTION OF THE DRAWINGS

The features of the present invention, which are believed to be novel, are set forth with particularity in the appended claims. The invention, together with further objects and advantages thereof, may best be understood by reference to the following description, taken in conjunction with the accompanying drawings, in the several figures of which like reference numerals identify like elements, and in which:

DETAILED DESCRIPTION OF THE PREFERRED EMBODIMENT

Figure 1:
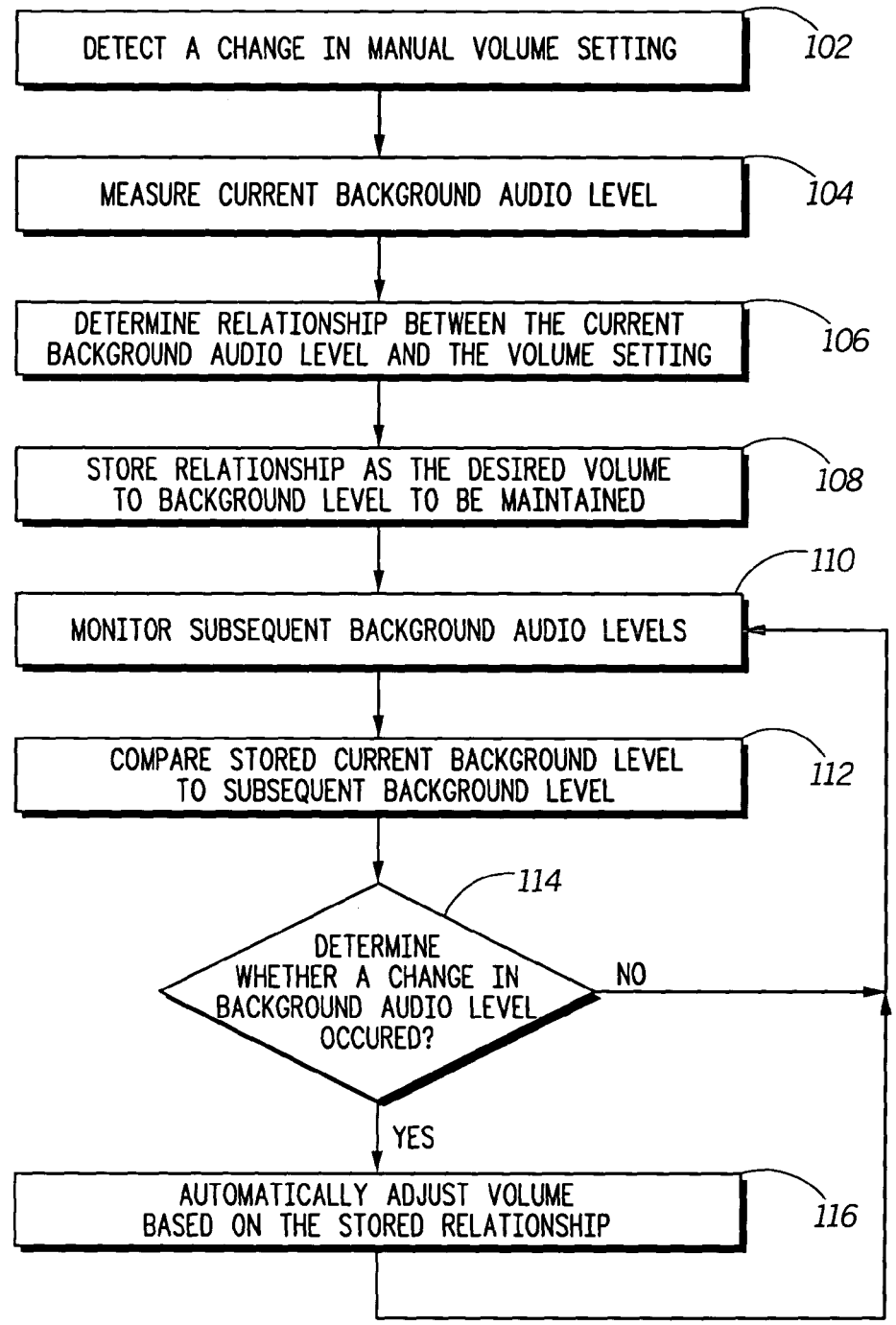
FIG. 1 is method for automatically adjusting volume in a communication device in accordance with the present invention.

While the specification concludes with claims defining the features of the invention that are regarded as novel, it is believed that the invention will be better understood from a consideration of the following description in conjunction with the drawing figures, in which like reference numerals are carried forward.

In accordance with the present invention, there is provided herein an improved automatic volume control (AVC) technique for a communication device. In accordance with the present invention, an intelligent automatic volume control technique takes a measurement of the environment (background noise) at the time a user manually selects the volume. A user preference of the volume setting made relative to the background noise experienced is thus established. The informational relationship of volume setting and background noise is stored and used when it is time to make an AVC determination. When the intelligent AVC of the present invention determines that the background noise has changed significantly, the AVC makes changes to the volume of the communication device. The current background noise level, the initial user volume setting and the background noise level when that volume was set are all used in the volume change decision making process.

FIG. 1 is a method of automatically adjusting the volume in a communication device in accordance with the present invention. Method 100 begins by detecting a change in manual volume setting at step 102 and measuring current (initial) background audio level at step 104. A relationship is determined between the current background audio level and the volume setting at step 106 and is stored at step 108 as the desired volume to background audio level.

By monitoring subsequent background audio levels at step 110 and comparing the stored current background level to the subsequent background level at step 112, the radio determines whether a change in background level occurred at step 114. The radio automatically adjusts the volume of the communication device, if needed, based on the relationship at step 116 when a change in background audio level occurs. Once adjusted at step 116, or if no adjustment was required as determined at step 114, the technique returns to monitoring at step 110.

Figure 2:
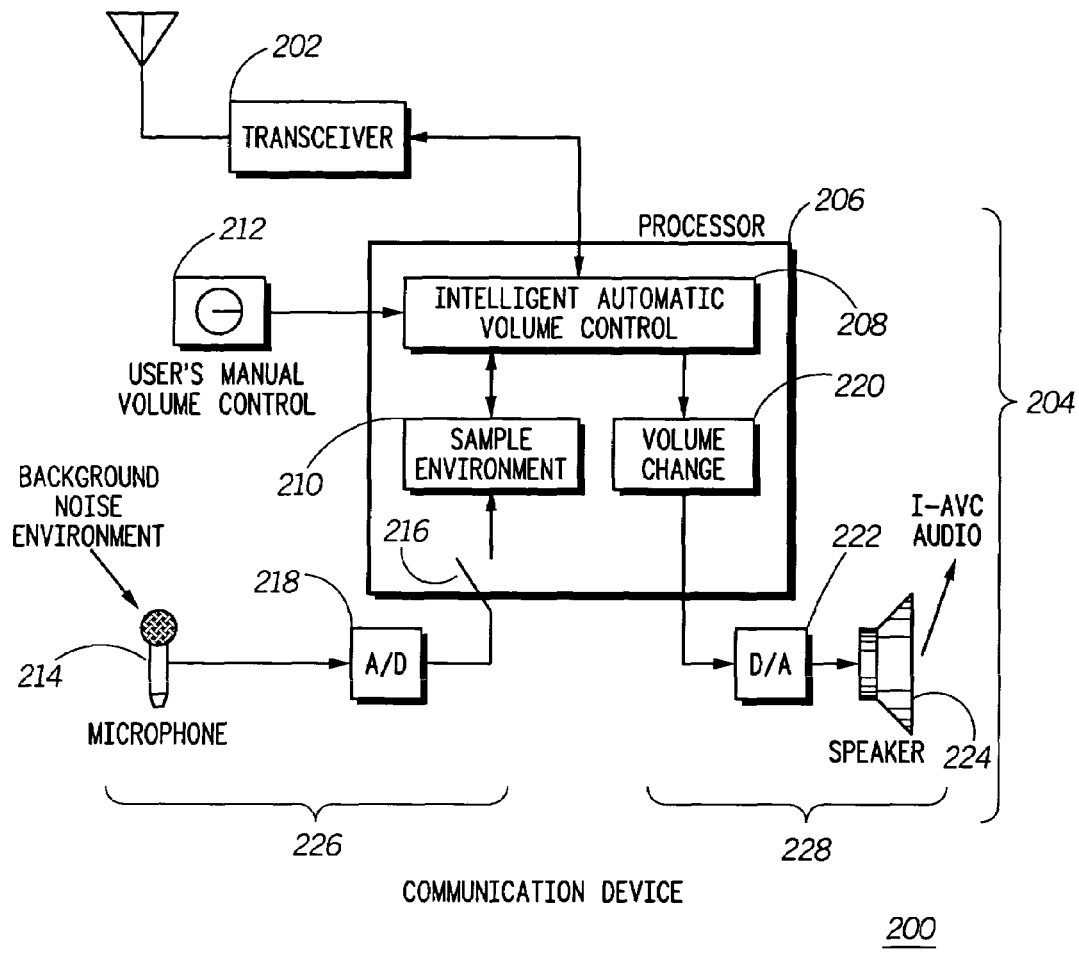
FIG. 2 is a block diagram of a communication device formed in accordance with the present invention.

FIG. 2 is a block diagram of a communication device formed in accordance with the present invention. Communication device 200 includes a transceiver portion 202 for transmitting and receiving RF signals and a controller portion 204 for processing the signals. In accordance with the present invention, the controller portion 204 provides automatic control over the preferred volume settings in the communications device 200. In accordance with the present invention, controller portion 204 determines when to sample the audio environment and then uses preferences and current background audio information to intelligently decide what volume change, if any, is needed.

Controller portion 204 includes a processor 206, a manual user's volume control 212, along with a microphone path 226 and speaker path 228. Processor 206 includes, in accordance with the present invention, an intelligent automatic volume control portion 208. A sampled audio environment 210 for a particular manual volume setting 212 is presented to the intelligent AVC 208 and stored as the desired volume level for that background level. In accordance with the present invention, any subsequent change in the manual volume control 212 is sensed by the AVC 208 which in turn causes the background audio environment to be sampled via microphone path 226 and, if needed, audio level to be altered via speaker path 228.

When a subsequent change to the user's manual volume control 212 is sensed by the intelligent AVC 208, the AVC 208 causes the audio environment to be sampled via a microphone 214 via switch 216 and analog to digital converter 218. If the intelligent AVC 208 determines, based on the stored background level, stored volume setting, and sampled audio level that an adjustment is needed, then a volume change output 220 is generated to alter the volume level of the communication device. The volume change output 220 is sent to a digital to analog converter 222 and output to speaker 224 to control the volume level.

Traditional AVC is not aware of the user's preferences as related to the relationship between the volume setting and the background level at the time the volume was set. The automatic volume control technique and apparatus of the present invention maintains the user's desired relationship between the volume heard at the speaker and the current background environment. Thus, a user-selected relationship is maintained despite a changing background environment.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method for controlling volume in a two-way communication device, comprising: detecting a change in manual volume setting; measuring current background audio level; determining a relationship between the current background audio level and the volume setting; establishing the relationship as a desired volume level to be maintained; sensing a subsequent change in the manual volume setting; monitoring subsequent background audio level by engaging a microphone of the two-way radio only when the subsequent change in the manual volume setting is detected; comparing the current background level to the subsequent background level; determining whether a change in background level occurred; and automatically adjusting volume of a speaker of the two-way radio based on the relationship.

2. A method for controlling volume in a communication device, comprising: manually setting a volume control for an initial background audio level; establishing the set volume as the preferred volume setting for that initial background audio level, thereby establishing a user-preferred relationship; monitoring subsequent background audio levels by engaging in a microphone only when a change in manual volume control setting occurs; and maintaining an audio level for the subsequent background audio levels based on the preferred volume setting for the initial background audio level.

3. A communication device, including: a controller for monitoring background audio levels;
a manual volume control coupled to the controller, the manual volume control setting a volume level as a user preference for a current background audio level;
a microphone coupled to the controller for monitoring background noise levels only when changes in the manual volume control are detected; and
the controller providing automatic adjustment of the volume level based on the user preference for the current background audio level in response to any change in the monitored background audio level.

4. A communication device, comprising:
a transceiver portion for transmitting and receiving RF signals for two-way radio communication;
a controller coupled to the transceiver portion, the controller having an intelligent automatic volume control (AVC) for determining when to sample an audio environment;
a manual volume control coupled to the controller, the manual volume control establishing a user selected preferred volume level for an initial background audio level;
a microphone coupled to the controller via a switch, said AVC engaging the microphone to sample subsequent background audio levels only when a subsequent change to the manual volume control is sensed by the intelligent AVC; and
a speaker coupled to the controller, the speaker having a volume level automatically adjusted by the controller based on the initial background audio level, the sampled subsequent background audio level and the user preferred volume level for the initial background audio level thereby maintaining a user established relationship between the volume heard at the speaker and the sampled subsequent background.

* * * * *